United States Patent [19]
Nakamura et al.

[11] Patent Number: 5,508,553
[45] Date of Patent: Apr. 16, 1996

[54] TRANSVERSAL BIPOLAR TRANSISTOR INTEGRATED WITH ANOTHER TRANSISTOR COMMONLY PROVIDED ON A SEMICONDUCTOR SUBSTRATE

[75] Inventors: Satoshi Nakamura; Tsutomu Tashiro, both of Tokyo, Japan

[73] Assignee: NEC Corporation, Japan

[21] Appl. No.: 332,845

[22] Filed: Nov. 1, 1994

[30] Foreign Application Priority Data

Nov. 1, 1993 [JP] Japan .................................... 5-273333

[51] Int. Cl.$^6$ .......................... H01L 29/72; H01L 29/161; H01L 29/70
[52] U.S. Cl. .......................... 257/576; 257/523; 257/525; 257/511; 257/556; 257/557; 257/588; 257/592
[58] Field of Search .................................... 257/576, 559, 257/511, 523, 525, 555, 556, 566, 575, 557, 588, 592

[56] References Cited

U.S. PATENT DOCUMENTS

| | | | |
|---|---|---|---|
| 4,583,106 | 4/1986 | Anantha et al. | 257/559 |
| 5,065,209 | 11/1991 | Spratt et al. | 257/755 |
| 5,073,810 | 12/1991 | Owada et al. | 257/588 |
| 5,117,271 | 5/1992 | Comfort et al. | 257/586 |
| 5,198,375 | 3/1993 | Hayden et al. | 437/31 |
| 5,315,151 | 5/1994 | Hsieh et al. | 257/559 |
| 5,321,301 | 6/1994 | Sato et al. | 257/588 |
| 5,323,032 | 6/1994 | Sato et al. | 257/588 |

FOREIGN PATENT DOCUMENTS 62-141760 6/1987 Japan.
1-211969 8/1989 Japan.

OTHER PUBLICATIONS

Patent Abstract of Japan, vol. 15, No. 394 (E–1119), Oct. 7, 1991 & JP–A–03 159 130 (Fujitsu Ltd.) Jul. 9, 1991.
Sato, Fumihiko et al., *1992 Symposium on VLSI Technology Digest of Technical Papers*, "A Novel Selective SiGe Epitaxial Growth Technology for Self-aligned HBTs," 1992, pp. 62–63.
Sato, F. et al., *1990 IEEE*, "A 'Self-Aligned' Selective MBE Technology for High Performance Bipolar Transistors," 1990, pp. 607–610.

*Primary Examiner*—Rolf Hille
*Assistant Examiner*—Alexander Oscar Williams

[57] ABSTRACT

A transversal bipolar transistor is structured to have a single crystal semiconductor film provided on a single crystal semiconductor region which is provided on a semiconductor substrate. The semiconductor substrate is of a first conductivity type, and the single crystal semiconductor region is of a second conductivity type which is opposite to the first conductivity type. The single crystal semiconductor film is divided in the transversal direction into a central portion of the second conductivity type for a base region and left and right portions of the first conductivity type for emitter and collector regions. The transversal bipolar transistor may be integrated with a vertical bipolar transistor commonly on the semiconductor substrate.

18 Claims, 9 Drawing Sheets

5,508,553

TRANSVERSAL BIPOLAR TRANSISTOR INTEGRATED WITH ANOTHER TRANSISTOR COMMONLY PROVIDED ON A SEMICONDUCTOR SUBSTRATE

FIELD OF THE INVENTION

The invention relates to a semiconductor substrate, and more particularly to, the improvement on structure, operation speed and power consumption in a transversal bipolar transistor.

BACKGROUND OF THE INVENTION

A first conventional transversal bipolar transistor is described in the Japanese Patent Kokai No. 62-141760. In the first conventional transversal bipolar transistor, p-epitaxial regions are formed on an insulating substrate, and polysilicon layers are formed on silicon dioxide films formed to cross the central portions of the p-epitaxial regions. Impurities of n-conductivity type are injected into the p-epitaxial regions by using the polysilicon layers and silicon dioxide films as masks, so that a n-emitter region and a n-collector region are formed on the both sides of one of the p-epitaxial regions to provide the transversal bipolar transistor, and a n-source region and a n-drain region are formed on the both sides of the remaining one of the p-epitaxial region to provide the MOS transistor.

A second conventional transversal bipolar transistor is described in the Japanese Patent Kokai No. 1-211969. In the second conventional transversal bipolar transistor, a n-impurity region is selectively formed on a semi-insulating semiconductor substrate, and a p-impurity region is formed in the central portion of the n-impurity region to provide a base region, so that the remaining portions of the n-impurity region are for emitter and collector regions.

In the first conventional transversal bipolar transistor, however, there are disadvantages in that a width of the base region is difficult to be narrow, and high speed operation is hindered, because the width of the base region becomes large effectively in operation in which carriers emitted from the emitter region at the range of high current density propagate through the insulating substrate having a lower barrier, when a concentration of the base region is higher than that of the insulating substrate.

In the second conventional transversal bipolar transistor, there is a disadvantage in that it is difficult to be fabricated simultaneously with the fabrication of a high performance vertical bipolar transistor. For instance, it is impossible to fabricate a semiconductor integrated circuit having a vertical NPN bipolar transistor and a transversal PNP bipolar transistor which operates with high speed and low power consumption under a small number of steps and a low cost.

SUMMARY OF THE INVENTION

Accordingly, it is an object of the invention to provide a semiconductor device in which a width of a base region can be narrow.

It is a further object of the invention to provide a semiconductor device in which a width of a base region does not become large effectively in operation.

It is a still further object of the invention to provide a semiconductor device which operates with high speed and lower power consumption.

It is a still yet further object of the invention to provide a semiconductor device having a vertical NPN bipolar transistor and a transversal PNP bipolar transistor which is fabricated by a small number of steps and a low cost.

According to the invention, a semiconductor device, comprises:

a vertical bipolar transistor and a transversal bipolar transistor provided on a semiconductor substrate of one conductivity type, and separated from each other by a device separating region provided thereon;

the vertical bipolar transistor, comprising:

a first single crystal semiconductor region of an opposite conductivity type to the one conductivity type provided on the semiconductor substrate;

a first collector region of the opposite conductivity type provided in the first single crystal semiconductor region;

a first base region of the one conductivity type consisting of a first single crystal semiconductor film provided on the first single crystal semiconductor region;

a first emitter region of the opposite conductivity type provided in the first single crystal semiconductor film;

a first aperture provided through an interfacial insulating film to expose the first single crystal semiconductor region, the interfacial insulating film being provided on the first single crystal semiconductor region;

a first polycrystal semiconductor film of the one conductivity type provided on the interfacial insulating film to be connected via the aperture to the first base region;

a first side wall insulating film having inner and outer walls to contact with a side wall of the first polycrystal semiconductor film at the outer wall and cross a PN junction of the first emitter and base regions in the aperture; and a second polycrystal semiconductor film of the one conductivity type provided in an interior defined by the inner wall of the first side wall insulating film to contact with the first emitter region; and the transversal bipolar transistor, comprising:

a second single crystal semiconductor region of the opposite conductivity type provided on the semiconductor substrate;

a second base region of the opposite conductivity consisting of a central portion of a second single crystal semiconductor film provided on the second single crystal semiconductor region;

a second emitter region of the one conductivity type consisting of one side portion of the second single crystal semiconductor film;

a second collector region of the one conductivity type consisting of an opposite side portion to the one side portion of the second single crystal semiconductor film;

a second aperture provided through the interfacial insulating film to expose the second single crystal semiconductor region, the interfacial insulating film being also provided on the second single crystal semiconductor region;

a third polycrystal semiconductor film of the one conductivity type provided on the interfacial insulating film to be connected via the second aperture to the second emitter region;

a fourth polycrystal semiconductor film of the one conductivity type provided on the interfacial insulating film to be connected via the second aperture to the second collector region;

a second side wall insulating film having inner and outer walls to contact with side walls of the third and fourth polycrystal semiconductor films at the outer wall and cross PN junctions of the second base region relative to the second emitter and collector regions; and a fifth polycrystal semiconductor film of the conductivity type provided in an interior defined by the inner wall of the second side wall insulating film to contact with the second base region.

BRIEF DESCRIPTION OF THE DRAWINGS

The invention will be explained in more detail in conjunction with appended drawings, wherein.

DESCRIPTION OF THE PREFERRED EMBODIMENT

Before explaining a semiconductor device in a preferred embodiment according to the invention, the aforementioned first and second conventional semiconductor device will be explained in FIGS. 1A and 1B, and FIG. 2.

Figure 1A:
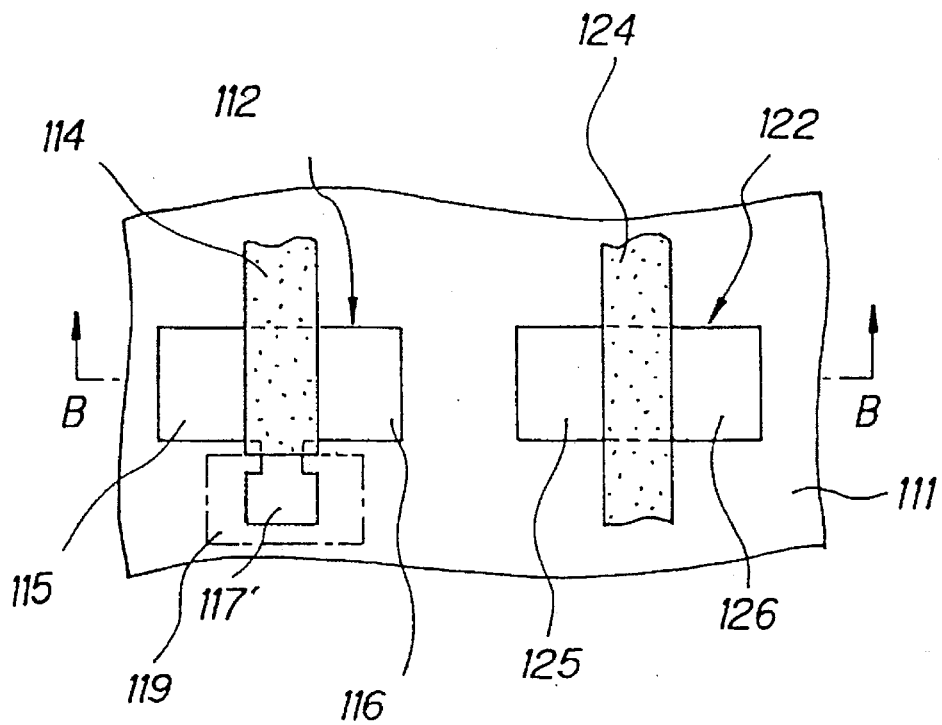
FIG. 1A is a plan view showing a first conventional semiconductor device.
Figure 1B:
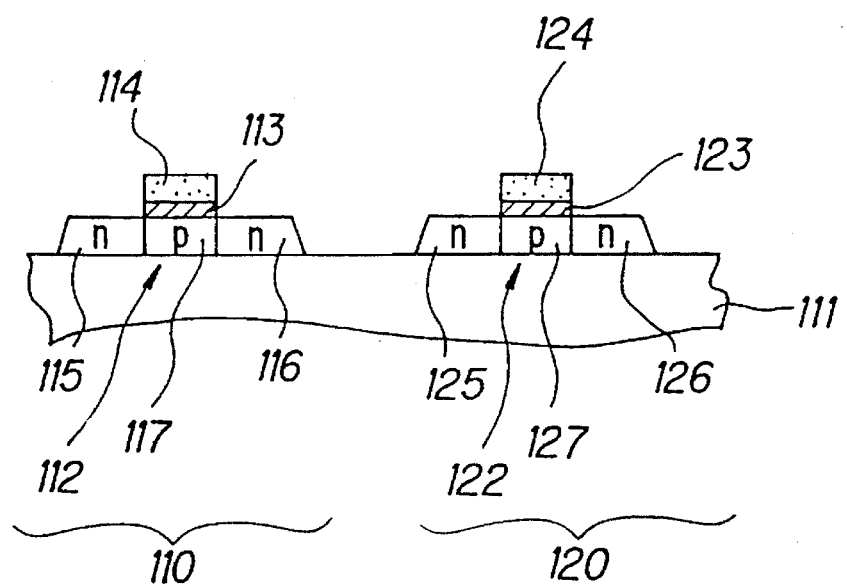
FIG. 1B is a cross-sectional view showing the first conventional semiconductor device.

FIGS. 1A and 1B shows the first conventional semiconductor device which is described in the Japanese Patent Kokai No. 62-141760. The first conventional semiconductor device comprises a transversal bipolar transistor 110 and a MOS transistor 120, respectively, provided on an insulating substrate 111. The transversal bipolar transistor 111 comprises a n-emitter region 115, a n-collector region 116, and a p-base region 117, a base pull-out region 117', a silicon dioxide film 113, and a polysilicon layer 114, while the MOS transistor 120 comprises a n-source region 125, a n-drain region 126, a p-channel region 127, a gate insulating film 123 of silicon dioxide, and a gate electrode 124 of polysilicon.

In fabrication, p-island regions 112 and 122 are formed with the base pull-out region 117' on the insulating substrate 111, and the silicon dioxide films 113 and 123, and the polysilicon layers 114 and 124 are formed with the same width on the p-island regions 112 and 122 and the insulating substrate 111. Then, the base pull-out region 117' is covered with a mask layer 119. Thereafter, n-impurities are injected into the p-island regions 112 and 122 in accordance with masks of the silicon dioxide films 113 and 123 and the polysilicon layers 114 and 124, thereby providing the n-regions 115, 116, 125 and 126.

Figure 2:
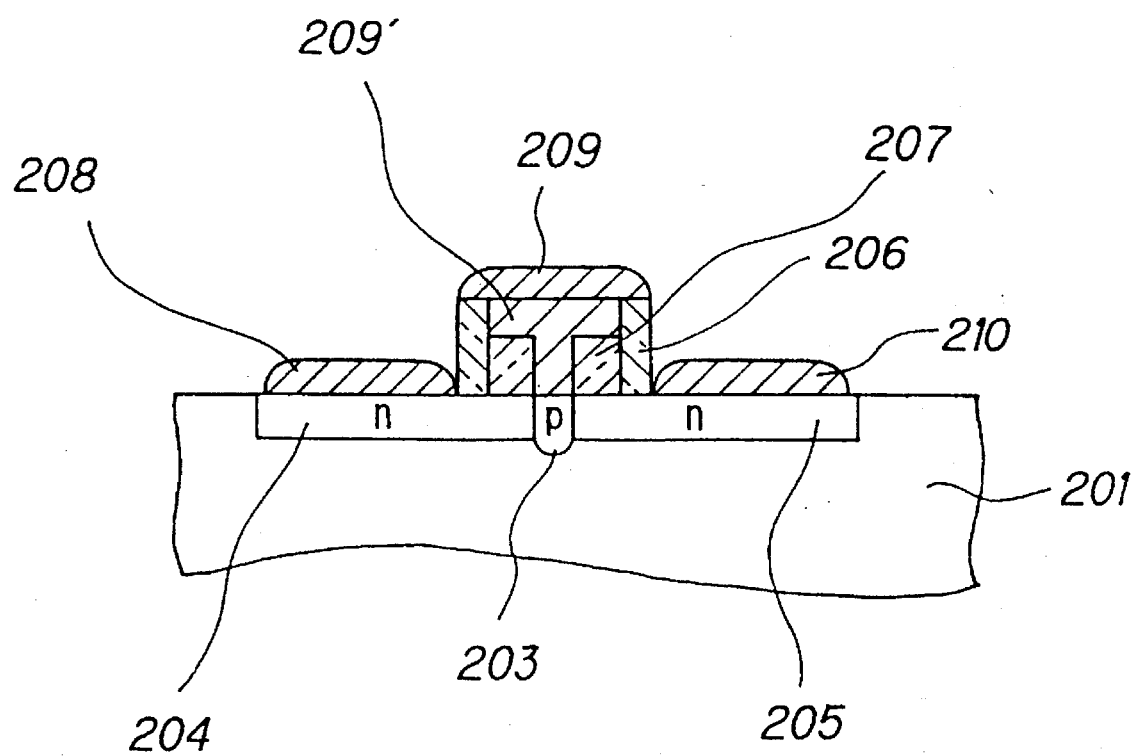
FIG. 2 is a cross-sectional view showing a second conventional semiconductor device.

FIG. 2 shows the second conventional semiconductor device of a transversal bipolar transistor which is described in the Japanese Patent Kokai No. 1-211969. The transversal bipolar transistor comprises a semi-insulating semiconductor substrate 201, an emitter region 204 of n-impurities, a collector region 205 of n-impurities, and a p-impurity region 203 formed in an upper skin layer of the substrate 201, and an emitter electrode 208, a base electrode 209, 209', and a collector electrode 210 formed on the substrate 201 to be insulated by dielectric films 206 and 207.

Figure 3:
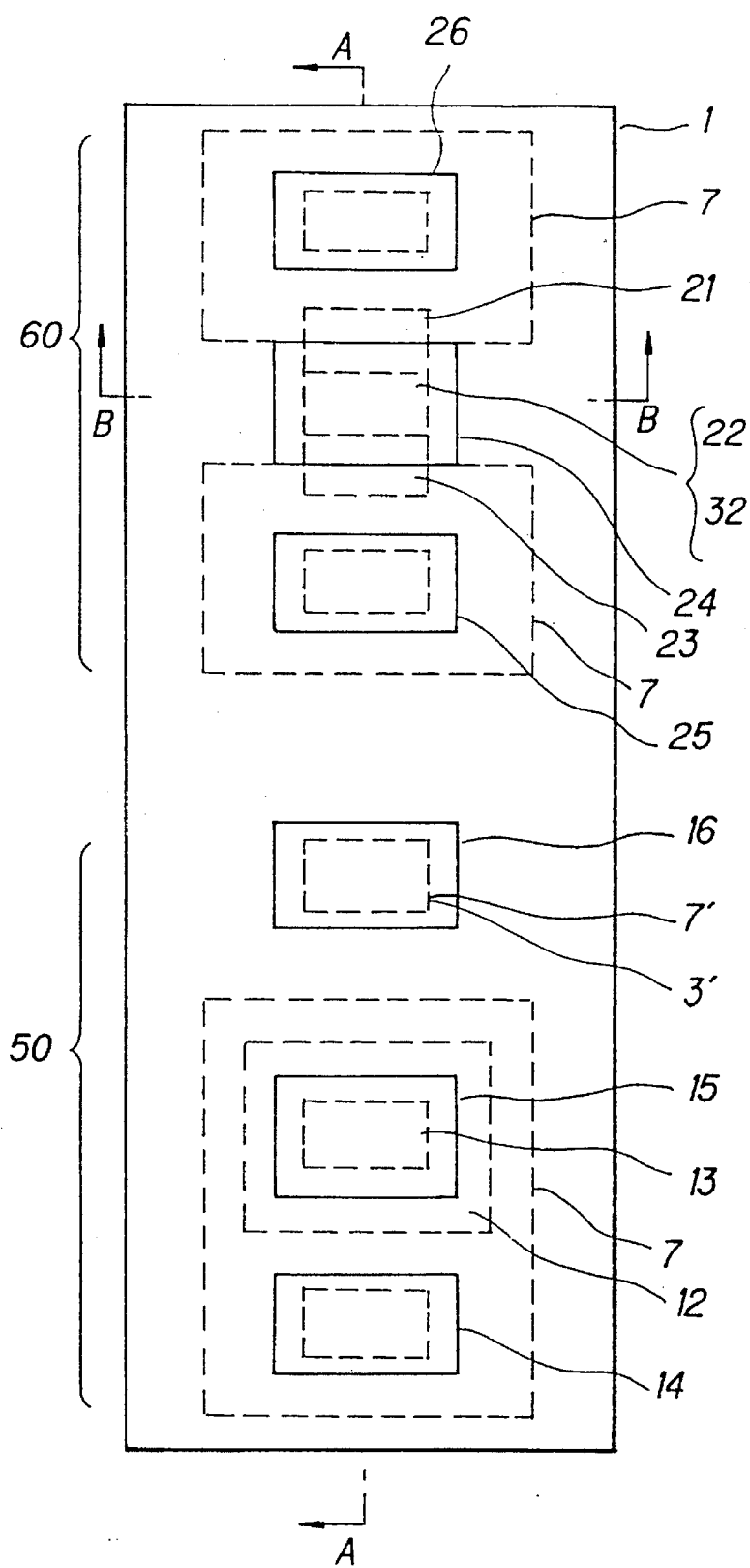
FIG. 3 is a plan view showing a semiconductor device in a preferred embodiment according to the invention.
Figure 4:
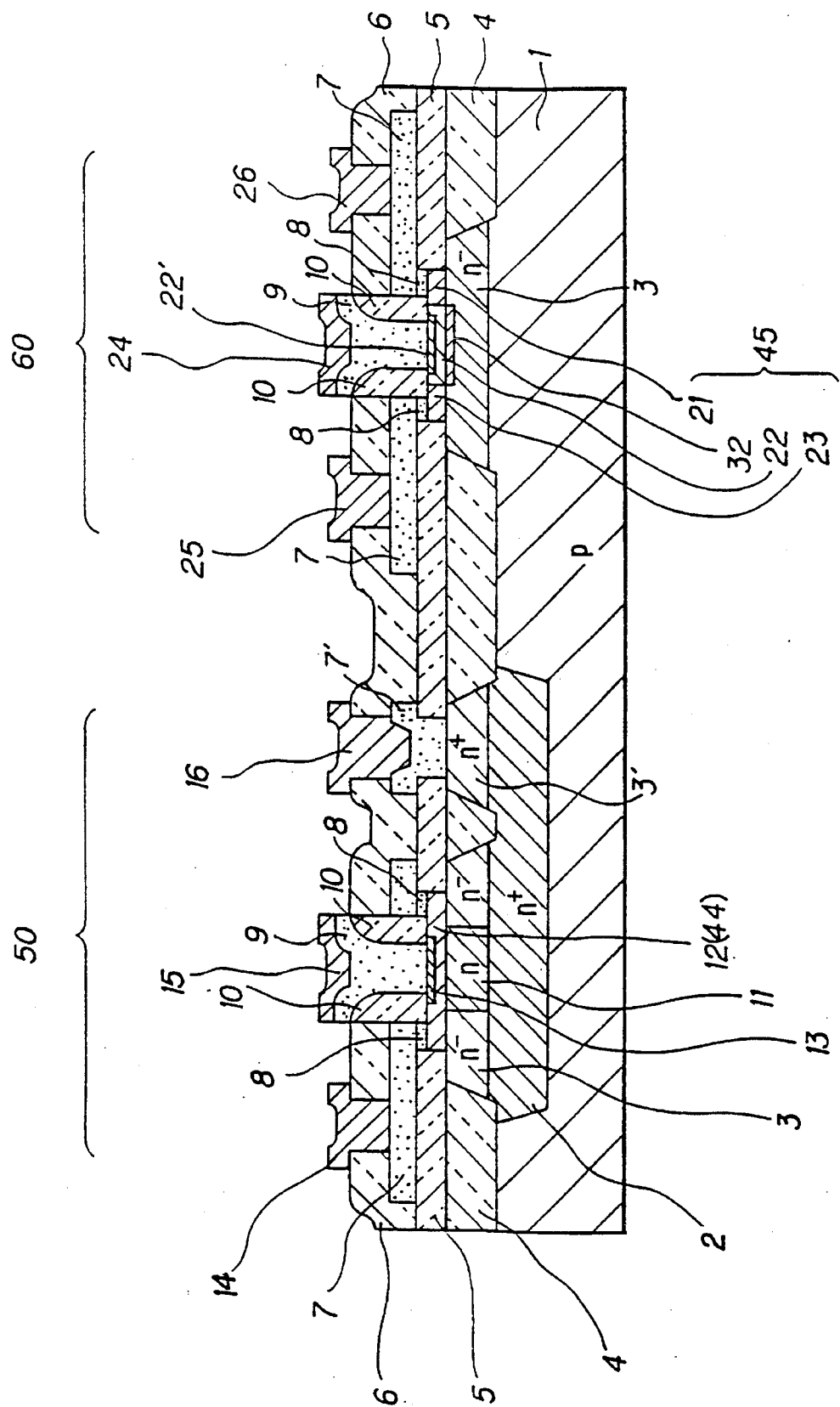
FIG. 4 is a cross-sectional view showing the semiconductor device cut along the line A—A in FIG. 3.

A semiconductor device in the first preferred embodiment according to the invention will be explained in FIGS. 3 to 5.

In the semiconductor device, a $n^-$-silicon epitaxial layer 3 is formed on a main plane of a p-silicon substrate 1, in which a $n^+$-low resistive region (buried region) 2 is selectively formed. A vertical NPN transistor 50 and a transversal PNP transistor 60 are formed on the main plane of the silicon substrate 1 to be separated by device separating regions 4 of silicon dioxide. In the vertical NPN bipolar transistor 50, a $n^+$-collector contact region 3' is formed on the buried region 2. An interfacial insulating film 5 of silicon dioxide is selectively formed on the $n^-$-silicon epitaxial layer 3 and the device separating region 4, and single crystal silicon germanium (SiGe) alloy films 44 and 45 are formed in openings of the interfacial insulating film 5 on the $n^-$-silicon epitaxial layers 3.

The vertical NPN transistor 50 comprises a p-base region (intrinsic base region) 12 which is the p-single crystal SiGe alloy film 44, a $n^+$-emitter region 13 formed in an upper portion of the base region 12, and a n-collector region 11 formed in the $n^-$-silicon epitaxial layer 3. In the vertical NPN transistor 50, a ring-shaped side wall insulating film 10 is provided across the $p^+$-emitter region 13 and the p-base region 12 thereon to contact with side walls of a silicon nitride film 6, a $p^+$-polysilicon film 7 and a p-polycrystal SiGe alloy film 8. The $p^+$-polysilicon film 7 contacts via the p-polycrystal SiGe alloy film 8 with the p-base region 12, and a $n^+$-polysilicon film 9 which is an impurity-diffusion source for the $n^+$-emitter region 13 is filled in an inner wall of the side wall insulating film 10 to contact with the $n^+$-emitter region 13. Further, a $n^+$-polysilicon film 7' is formed in an opening of the interfacial insulating film 5 to contact with the $n^+$-collector contact region 3' and a base electrode 14, an emitter electrode 15 and a collector electrode 16 are formed to contact with the polysilicon films 7, 9 and 7' via contact holes of the silicon nitride film 6.

In the transversal PNP transistor 60, a p-single crystal silicon-germanium alloy film 45 comprises a n-intrinsic base region 22 formed in the central portion thereof, a p-emitter region 23 formed on one side of the base region 22, a p-collector region 21 formed on the other side of the base region 22, and a $n^+$-hole stopper region 32 formed under the base region 22.

The $n^+$-hole stopper region 32 is a region which prevents holes in transit through the n-intrinsic base region 22 from penetration therefrom into the n-silicon epitaxial layer 3 resulting in elongation of effective base length. As shown in FIG. 3, the $n^+$-hole stopper region 32, the p-emitter region 23, the n-intrinsic base region 22, and the p-collector region 21 are rectangular and planar, and have the same width as each other (a dimension in a direction orthogonal to the emitter-collector).

The p-emitter region 23 is connected via the p-polysilicon germanium alloy film 8 to the $p^+$-polysilicon film 7 formed on the interfacial insulating film 5, and via the polysilicon film 7 to the emitter electrode 25 in the contact hole of the silicon nitride film 6. In the same manner, the p-collector region 21 is connected via the p-polysilicon germanium alloy film 8 to the p$^+$-polysilicon film 7 formed on the interfacial insulating film 5, and via the p$^+$-polysilicon film 7 to the collector electrode 26 in the contact hole of the silicon nitride film 6. Further, the ring-shaped side wall insulating film 10 is in contact with the silicon nitride film 6, the p$^+$-polysilicon film 7, and the p-polysilicon germanium alloy film 8 to cover portions including the p-n junctions of the emitter-base and the collector-base, and the base region 22 is connected via the n$^+$-base contact region 22' and the n$^+$-polysilicon film 9 to the base electrode 24.

Figure 5:
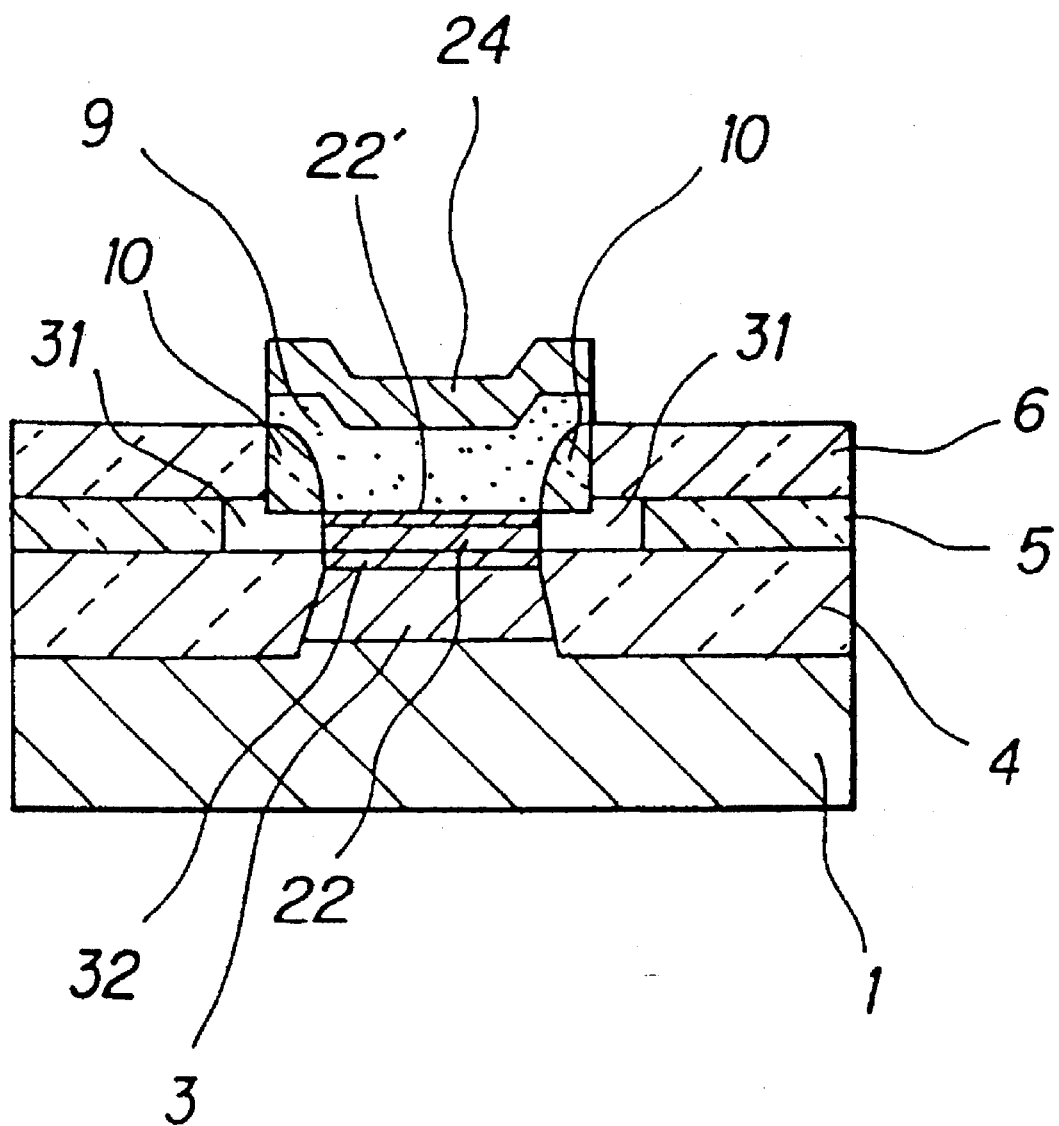
FIG. 5 is a cross-sectional view showing the semiconductor device cut along the line B—B in FIG. 3, FIGS. 6A to 6E are cross-sectional views showing steps of fabricating the semiconductor device as shown in FIGS. 3 to 5.

As shown in FIG. 5, the device separating region 4 is formed to be immediately under the side wall insulating film 10, such that a cavity 31 is formed under the side wall insulating film 10 by suppressing the growth of the p-single crystal silicon germanium alloy film 45. The n-base region 22 is formed by a whole length in a width direction of the single crystal silicon germanium alloy film 45. For this structure, the p-emitter region 23 which is a remaining portion of the p-single crystal silicon germanium alloy film 45, so that there is no short circuit between the p-emitter region 23 and the p-collector region 21.

Next, a method for fabricating the semiconductor device as explained in FIGS. 3 to 5 will be explained in FIGS. 6A to 6E.

Figure 6A:
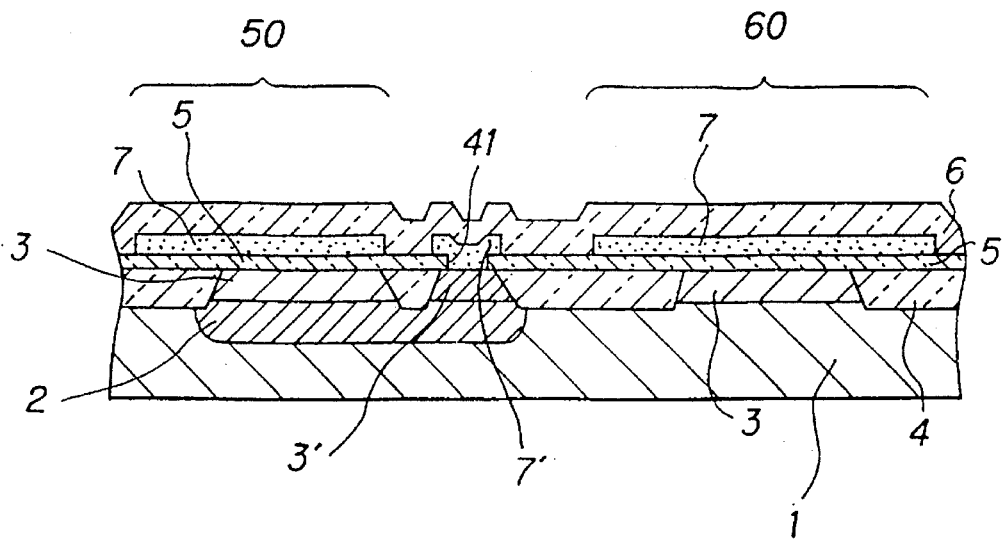

In FIG. 6A, a n$^+$-low resistive region (buried region) 2 is selectively formed on a p-silicon substrate 1, and a n$^-$-silicon epitaxial layer 3 is grown on a whole surface thereof. Then, a device separating region 4 is formed in accordance with selective oxidation using a mask of a silicon nitride film, so that regions for forming a vertical NPN transistor 50 and a transversal PNP transistor 60 are defined thereon. Then, a n$^+$-collector contact region 3' for the vertical NPN bipolar transistor 50 is formed in accordance with injection of n-impurities, and an interfacial insulating film 5 which is subsequently provided with an aperture 41 is formed on a whole surface thereof. The first layer of a polysilicon film is formed on a whole surface thereof, and a collector take-out layer 7' for the vertical NPN transistor 50 is formed in accordance with injection of n-impurities. In the same manner, a p$^+$-polysilicon film 7 which will be another electrode take-out layer is formed in accordance with injection of p-impurities. Subsequently, a silicon nitride film 6 is deposited on a whole surface thereof.

Figure 6B:
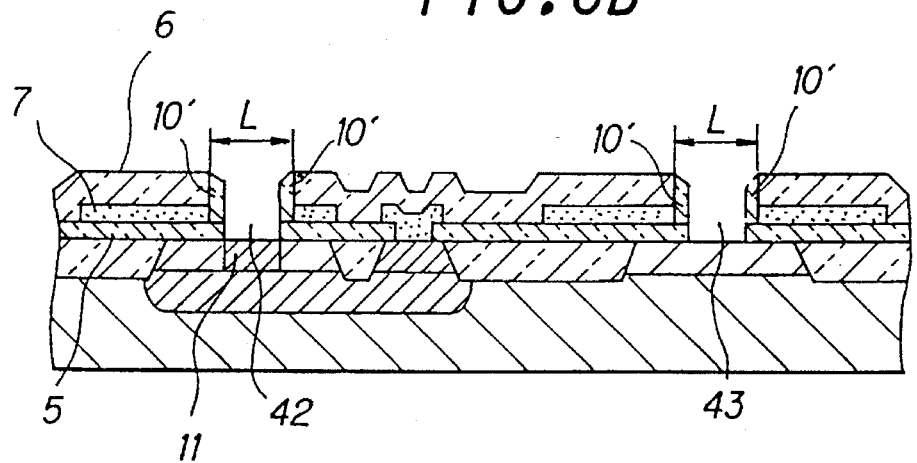

In FIG. 6B, apertures having a mask width of 0.6 μm are formed in accordance with selective removal of the silicon nitride film 6 and the p$^+$-polysilicon film 7 at positions for an emitter of the vertical NPN transistor 50 and a base of the transversal PNP transistor 60 by using anisotropic etching. Then, a first side wall insulating film 10' having a transversal direction thickness of 100 nm is formed on each side surface of the apertures by a silicon nitride film having a thickness of 100 nm deposited on a whole surface thereof and then anisotropically etched except for the side walls of the apertures. Then, the silicon nitride film 5 is removed to expose the n$^-$-silicon epitaxial film 3 by using the side wall insulating film 10' as a part of a mask, so that apertures 42 and 43 are formed at positions for an emitter of the vertical NPN transistor 50 and a base of the transversal PNP transistor 60. Then, a n-collector region 11 is formed in accordance with injection of n-impurities into the n$^-$-silicon epitaxial layer 3 exposed by the aperture 42, while the n$^-$-silicon epitaxial layer 3 exposed by the aperture 43 is masked by using resist.

Figure 6C:
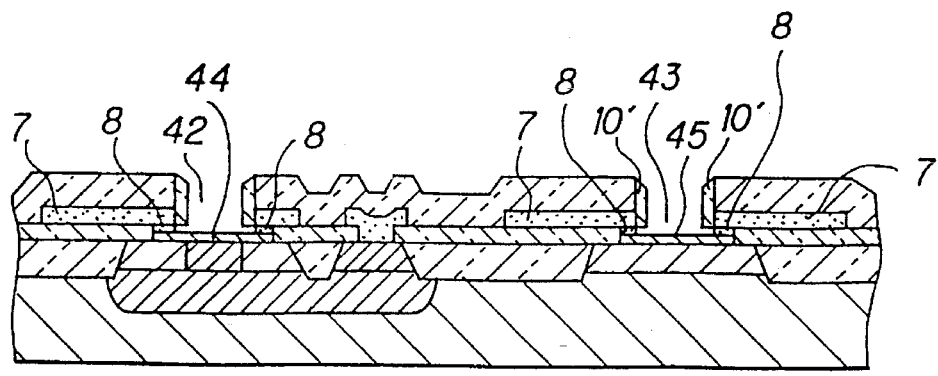

In FIG. 6C, the silicon dioxide film 5 is etched in the transversal direction to be removed under the side wall insulating films 10', so that the bottom of the p$^+$-polysilicon film 7 is finely exposed. Then, p-single crystal silicon germanium (SiGe) alloy films 44 and 45 having a thickness of 100 nm and a boron concentration of 1×10$^{18}$/cm$^3$ are grown on the n$^-$-silicon epitaxial layer 3 including the n-collector region 11 below the aperture 42 and the n-silicon epitaxial layer 3 below the aperture 43 in accordance with selective epitaxial growth using Si$_2$H$_6$ and GeH$_4$ as gas source and B$_2$H$_6$ as p-doping gas.

At this time, p-polysilicon germanium (SiGe) alloy films 8 are grown on the exposed bottoms of the p$^+$-polysilicon film 7 to be finally connected to p-single crystal silicon germanium alloy films 44 and 45. Thus, the p$^+$-polysilicon films 7 and the p-single crystal silicon germanium alloy films 44 and 45 are electrically connected by the p-polysilicon germanium (SiGe) alloy films 8, respectively. The p-single crystal silicon germanium alloy film 44 will be a p-base region 12 for the vertical NPN transistor 50. As explained before, the device separating region 4 is formed to be more inside than the side wall insulating film 10' thinner in film thickness than a complete side wall insulating film 10. Therefore, the p-single crystal silicon germanium alloy film 45 is grown only on the n$^-$-silicon epitaxial layer 3 surrounded by the side wall insulating film in the transversal PNP transistor 60.

In this preferred embodiment, a p-single crystal silicon film may be grown for the single crystal semiconductor films 44 and 45, and a p-polysilicon film may be grown for the polysilicon semiconductor film 8, wherein Si$_2$H$_6$ is used as gas source, and B$_2$H$_6$ is used as p-doping gas.

The above described self-aligned base selective growth technology is explained in a report "A Novel Selective SiGe Epitaxial Growth Technology for aligned HBTs" by F. Sato, et al., "1992 Symposium on VLSI Technology Digest of Technical Paper", and on pages 607 to 610 of "Tech. Dig., 1990, IEEE IEDM" as a report "A Self-aligned Selective MBE Technology for High-Performance Bipolar Transistor" by F. Sato, et al.

Figure 6D:
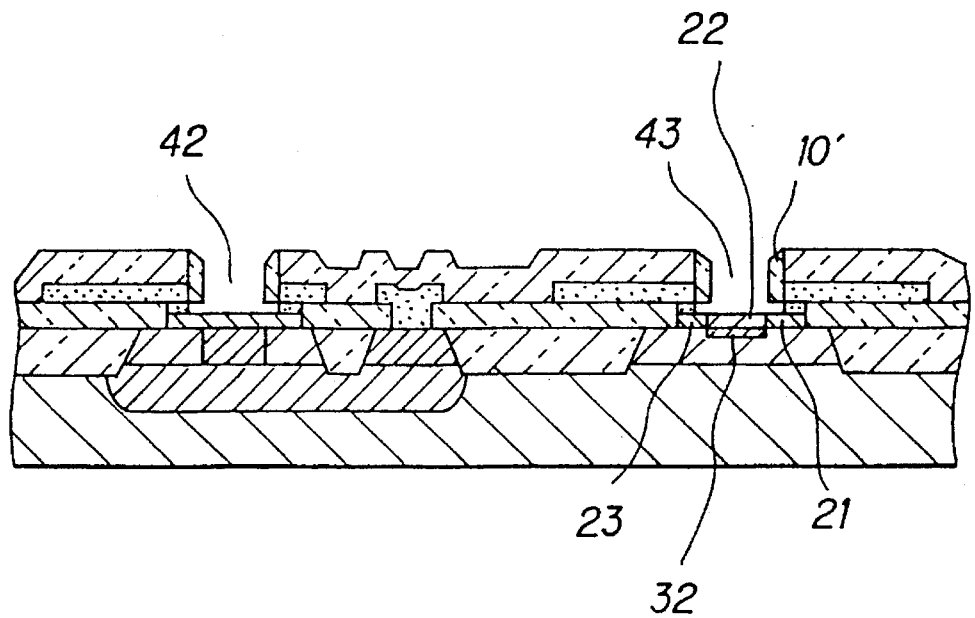

In FIG. 6D, the aperture 42 which will be an emitter for the vertical NPN transistor 50 is masked by assist, and a n-intrinsic base region 22 and a n$^+$-hole stopper region 32 therebelow are formed in the central portion of the p-single crystal silicon germanium alloy film 45 which is not covered with the side wall insulating film 10' in the aperture 43 for the transversal PNP transistor 60 in accordance with selective ion injection by using the side wall insulating film 10' as a part of a mask. For instance, phosphor is ion-injected for n-impurities to provide the n-intrinsic base region 22 in accordance with a dose of 1×10$^{14}$/cm$^2$ under an acceleration energy of 10 keV, and the same is carried out to provide the n$^+$-hole stopper region 32 in accordance with a dose of 1×10$^{15}$/cm$^2$ under an acceleration energy of 20 keV. Then, the regions 22 and 32 are obtained simultaneously by activating thermal treatment. Thus, a p-emitter region 23 and a-collector region 21 are simultaneously obtained in the p-single crystal silicon germanium alloy film 45 on the both sides of the n-intrinsic base region 22.

Figure 6E:
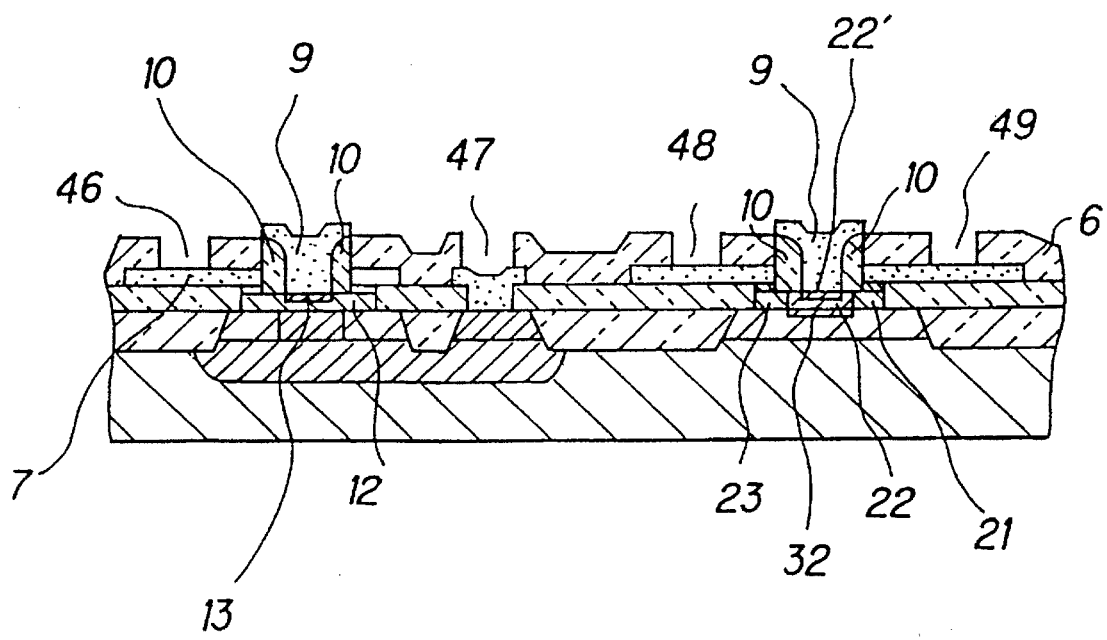

In FIG. 6E, a PSG film and a silicon nitride film are deposited on a whole surface to fill interstices below the side wall insulating films 10', and anisotropic etching is carried out to cover the first side wall insulating films 10 with the PSG and silicon nitride films, so that second side wall insulating films 10 each having a thickness of 200 nm are formed on side walls of the silicon nitride film 6, the p$^+$-polysilicon layer 7, and the p-polysilicon germanium alloy film 8 in the apertures 42 and 43. Then, a n$^+$-polysilicon film doped with n-impurities of P or As is deposited on a whole surface, and is patterned to provide take-out layers 9 for respective electrodes. Then, the n-impurities of the $n^+$-polysilicon layers 9 are thermally diffused into the p-single crystal silicon germanium film 44 and the base region 22, so that a $n^+$-emitter region 13 for the vertical NPN transistor 50 and a $n^+$-base contact region 22' for the transversal PNP transistor 60 are formed, respectively, below the $n^+$-polysilicon layers 9. Further, the silicon nitride film 6 is etched to provide a base electrode contact hole 46 and a collector electrode contact hole 47 for the vertical NPN transistor, and an emitter electrode contact hole 48 and a collector electrode contact hole 49 for the transversal PNP transistor 60. Then, vapors of Al are deposited to provide an Al film on a whole surface, and the Al film is patterned to provide respective electrodes 14, 15, 16, 24, 25 and 26. Thus, the semiconductor device as shown in FIGS. 3 to 5 is fabricated.

Figure 7:
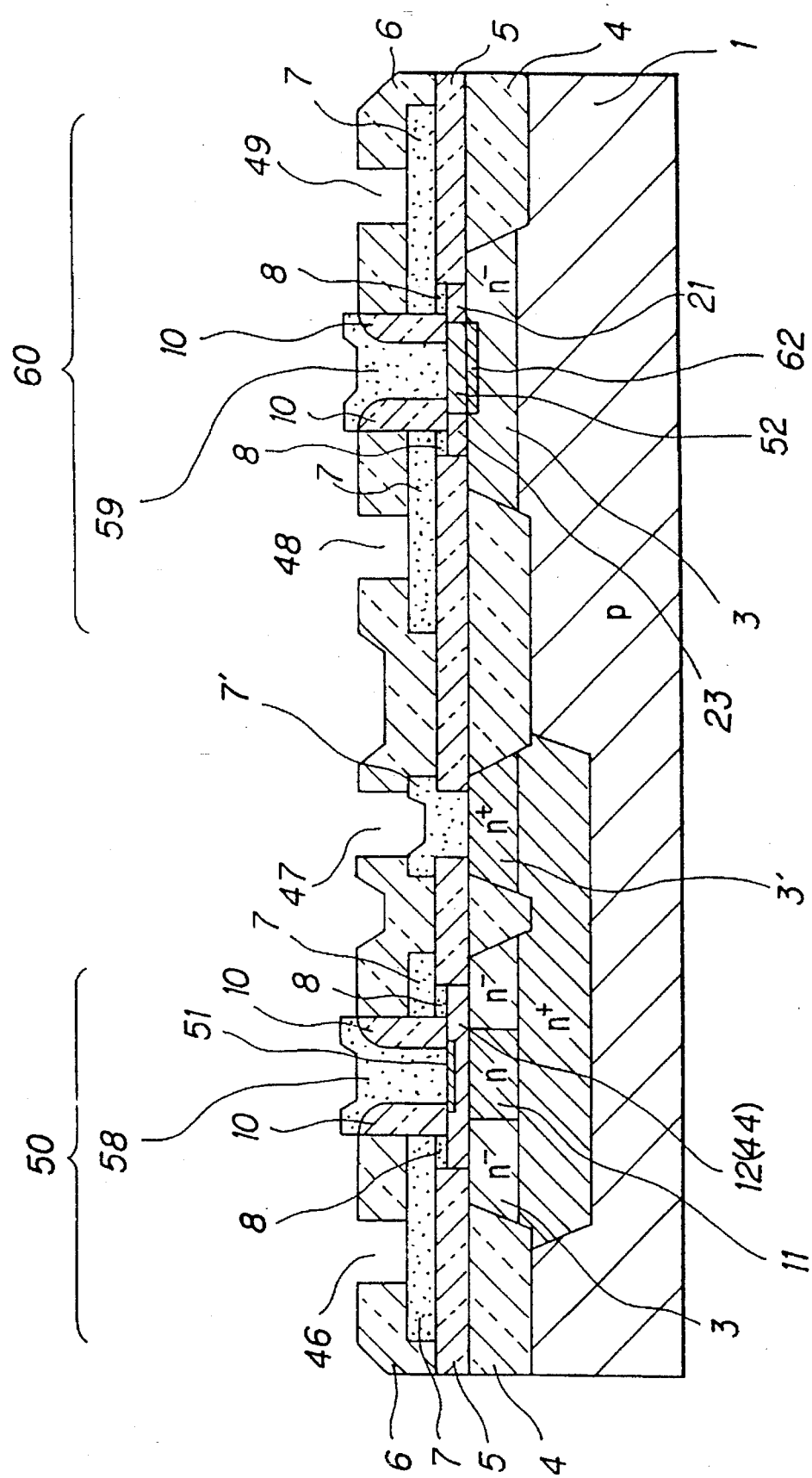
FIG. 7 is a cross-sectional view showing a semiconductor device in another preferred embodiment according to the invention.

FIG. 7 shows another method for fabricating a semiconductor device, wherein like parts are indicated by like reference numerals as used in FIGS. 4, and 6A to 6E.

After the structure as shown in FIG. 6D is obtained, a take-out polysilicon layer 51 for an emitter electrode of the vertical NPN transistor 50 is formed by depositing and patterning a $n^+$-polysilicon film doped with As. In order to provide a $n^+$-hole stopper region 62, n-impurities are ion-injected into the aperture for the transversal PNP transistor 60, and a $n^+$-polysilicon film doped with p is deposited on a whole surface, and is patterned to provide a base electrode take-out polysilicon layer 59 for the transversal NPN transistor 60. Then, As in the $n^+$-polysilicon layer 58 is thermally diffused into the p-single crystal silicon germanium alloy film 44 to provide an emitter region 51 for the vertical NPN transistor 50. At the same time, P in the $n^+$-polysilicon layer 59 is thermally diffused into the p-single crystal silicon germanium alloy film 45 to provide a n-intrinsic base region 52 for the transversal PNP transistor 60 by using the difference of diffusion constants between As and P. Further, the silicon nitride film 6 is etched to provide the base electrode contact hole 46 and the collector electrode contact hole 47 for the vertical NPN transistor 50, and the emitter electrode contact hole 48 and the collector electrode contact hole 49 for the transversal PNP transistor 60, as shown in FIG. 7. Then, vapors of Al are deposited to provide an Al film which is patterned to provide the respective electrodes, as shown in FIG. 4.

Figure 8:
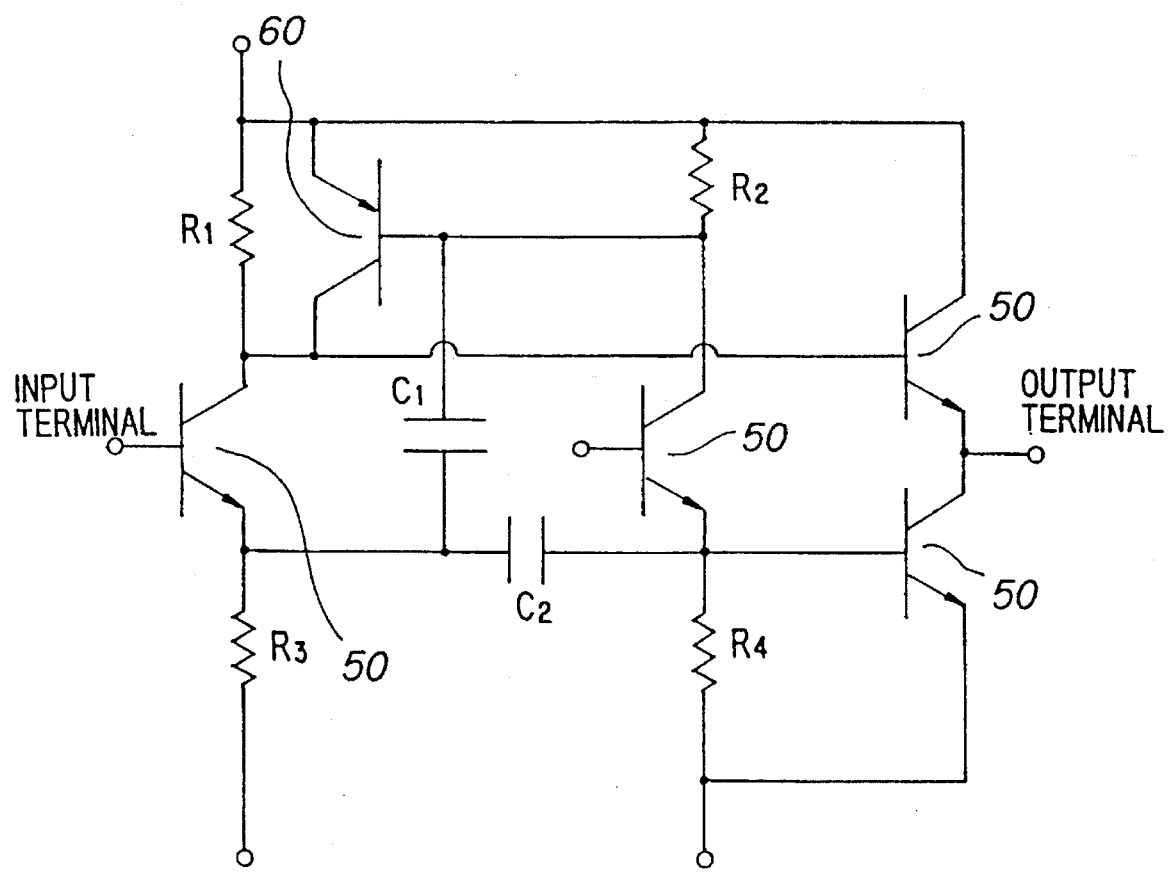
FIG. 8 is a circuit diagram of a logic circuit using the semiconductor device in the preferred embodiment.

As explained above, the vertical NPN and transversal PNP transistors 50 and 60 both having high performance are fabricated, and integrated with resistances R1 to R4 and capacitors C1 and C2 to be a semiconductor integrated circuit, as shown in FIG. 8.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A semiconductor device, comprising:

a vertical bipolar transistor and a transversal bipolar transistor provided on a semiconductor substrate of one conductivity type, and separated from each other by a device separating region provided thereon;

said vertical bipolar transistor, comprising:

a single crystal semiconductor region of an opposite conductivity type to said one conductivity type provided on said semiconductor substrate;

a collector region of said opposite conductivity type provided in said single crystal semiconductor region;

a base region of said one conductivity type being a single crystal semiconductor film provided on said single crystal semiconductor region;

an emitter region of said opposite conductivity type provided in said single crystal semiconductor film;

an aperture provided through an interfacial insulating film to expose said single crystal semiconductor region, said interfacial insulating film being provided on said single crystal semiconductor region;

a first polycrystal semiconductor film of said one conductivity type provided on said interfacial insulating film to be connected via said aperture to said base region;

a side wall insulating film having inner and outer walls and contacting with a side wall of said first polycrystal semiconductor film at said outer wall and crossing a PN junction of said emitter and base regions in said aperture; and a second polycrystal semiconductor film of said one conductivity type provided in an interior defined by said inner wall of said side wall insulating film to contact with said emitter region; and said transversal bipolar transistor comprising:

a single crystal semiconductor region of said opposite conductivity type provided on said semiconductor substrate;

a base region of said opposite conductivity being of a central portion of a single crystal semiconductor film provided on said single crystal semiconductor region of said transversal bipolar transistor;

an emitter region of said one conductivity type being of one side portion of said single crystal semiconductor film of said transversal bipolar transistor;

a collector region of said one conductivity type being of an opposite side portion to said one side portion of said single crystal semiconductor film of said transversal bipolar transistor;

an aperture provided through said interfacial insulating film to expose said single crystal semiconductor region of said transversal bipolar transistor, said interfacial insulating film of said transversal bipolar transistor being also provided on said single crystal semiconductor region of said transversal bipolar transistor;

a third polycrystal semiconductor film of said one conductivity type provided on said interfacial insulating film of said transversal bipolar transistor to be connected via said aperture of said transversal bipolar transistor to said emitter region of said transversal bipolar transistor;

a fourth polycrystal semiconductor film of said one conductivity type provided on said interfacial insulating film of said transversal bipolar transistor to be connected via said aperture of said transversal bipolar transistor to said collector region of said transversal bipolar transistor;

a side wall insulating film having inner and outer walls to contact with side walls of said third and fourth polycrystal semiconductor films at said outer wall and cross PN junctions of said base region of said transversal bipolar transistor relative to said emitter and collector regions of said transversal bipolar transistor; and a fifth polycrystal semiconductor film of said conductivity type provided in an interior defined by said inner wall of said side wall insulating film of said transversal bipolar transistor to contact with said base region of said transversal bipolar transistor;

said base region of said transversal bipolar transistor, comprising:

a base contact region of said opposite conductivity type on an intrinsic base region of said opposite conductivity type, said intrinsic base region and base contact region being disposed between said collector region and said emitter region.

2. A semiconductor device, according to claim 1, wherein:

said base region of said transversal bipolar transistor, comprising:

said intrinsic base region connected via said base contact region to said fifth polycrystal semiconductor film, and via a hole stopper region of said opposite conductivity type to said single crystal semiconductor region of said transversal bipolar transistor, said base contact region and said hole stopper region being higher in concentration of impurities than said intrinsic base region and said single crystal semiconductor region.

3. A semiconductor device, according to claim 1, wherein:

said side wall insulating films of said vertical bipolar transistor and said transversal bipolar transistor are of a multiple layer structure comprising silicon nitride films.

4. A semiconductor device, according to claim 1, wherein:

thicknesses of said side wall insulating films of said vertical bipolar transistor and said transversal bipolar transistor are in a transversal direction.

5. A semiconductor device, according to claim 1, wherein:

said single crystal semiconductor films of said vertical bipolar transistor and said transversal bipolar transistor are of single crystal silicon germanium alloy films.

6. A semiconductor device, according to claim 1, wherein:

said first, third and fourth polycrystal semiconductor films are of polycrystal silicon germanium alloy films at connected portions with said first base region, said second emitter region, and said second collector region.

7. A semiconductor device, according to claim 1, wherein:

said first, third and fourth polycrystal semiconductor films are of polycrystal silicon film at extended portions on said interfacial insulating film.

8. A semiconductor device, according to claim 1, wherein:

said single crystal semiconductor films of said vertical bipolar transistor and said transversal bipolar transistor are of single crystal silicon films.

9. A semiconductor device, according to claim 1, wherein:

said first, third and fourth polycrystal semiconductor films are of polycrystal silicon films at extended portions on said interfacial insulating films and at connected portions with said base region of said vertical bipolar transistor, said emitter region of said transversal bipolar transistor and said collector region of said transversal bipolar transistor.

10. A semiconductor device, according to claim 1, wherein:

said vertical bipolar transistor is a NPN bipolar transistor, and said transversal bipolar transistor is a PNP bipolar transistor.

11. A semiconductor device, comprising:

a transversal bipolar transistor provided on a semiconductor substrate of one conductivity type, and separated by a device separating region provided thereon from another transistor;

said transversal bipolar transistor, comprising:

a single crystal semiconductor region of an opposite conductivity type to said one conductivity type provided on said semiconductor substrate;

a base region of said opposite conductivity being of a central portion of a single crystal semiconductor film provided on said single crystal semiconductor region;

emitter region of said one conductivity type being one portion of said single crystal semiconductor film;

a collector region of said one conductivity type being an opposite side portion to said one side portion of said single crystal semiconductor film;

an aperture provided through said interfacial insulating film to expose said single crystal semiconductor region, said interfacial insulating film being provided on said single crystal semiconductor region;

a first polycrystal semiconductor film of said one conductivity type provided on said interfacial insulating film to be connected via said aperture to said emitter region;

a second polycrystal semiconductor film of said one conductivity type provided on said interfacial insulating film to be connected via said aperture to said collector region;

a side wall insulating film having inner and outer walls to contact with side walls of said first and second polycrystal semiconductor films at said outer wall and a cross PN junctions of said base region relative to said emitter and collector regions; and a third polycrystal semiconductor film of said one conductivity type provided in an interior defined by said inner wall of said side wall insulating film to contact with said base region, said base region including an intrinsic base region of said opposite conductivity type connected via a base contact region of said opposite conductivity type to said third polycrystal semiconductor film, and via a hole stopper region of said opposite conductivity type to said single crystal semiconductor region, said base contact region and said hole stopper region being higher in concentration of impurities than said intrinsic base region and said single crystal semiconductor region.

12. A semiconductor device, according to claim 11, wherein:

said side wall insulating film is of a multiple layer structure comprising silicon nitride films.

13. A semiconductor device, according to claim 11, wherein:

said single crystal semiconductor film is of a single crystal silicon germanium alloy film.

14. A semiconductor device, according to claim 11, wherein:

said first and second polycrystal semiconductor films are of polycrystal silicon germanium alloy films at connected portions with said emitter region, and said collector region.

15. A semiconductor device, according to claim 11, wherein:

said first and second polycrystal semiconductor films are of polycrystal silicon film at extended portions on said interfacial insulating film.

16. A semiconductor device, according to claim 11, wherein:

said single crystal semiconductor film is of a single crystal silicon film.

17. A semiconductor device, according to claim 11, wherein:

said first and second polycrystal semiconductor films are of polycrystal silicon films at extended portions on said interfacial insulating films and at connected portions with said emitter region, and said collector region.

18. A semiconductor device, according to claim 11, wherein:

said transversal bipolar transistor is a PNP bipolar transistor.

* * * * *